(12) United States Patent
Moen et al.

(10) Patent No.: US 10,386,903 B1
(45) Date of Patent: Aug. 20, 2019

(54) RACK POWER SHELF MIGRATION BETWEEN SINGLE-PHASE AND THREE-PHASE POWER

(71) Applicant: Amazon Technologies, Inc., Seattle, WA (US)

(72) Inventors: Michael Jon Moen, Olympia, WA (US); Brandyn David Giroux, Seattle, WA (US); Jing Wang, Seattle, WA (US)

(73) Assignee: Amazon Technologies, Inc., Seattle, WA (US)

( * ) Notice: Subject to any disclaimer, the term of this patent is extended or adjusted under 35 U.S.C. 154(b) by 130 days.

(21) Appl. No.: 15/715,760

(22) Filed: Sep. 26, 2017

(51) Int. Cl.
| | |
|---|---|
| G06F 1/18 | (2006.01) |
| G06F 1/26 | (2006.01) |
| H02J 9/06 | (2006.01) |
| H05K 7/14 | (2006.01) |
| G06F 1/30 | (2006.01) |
| G06F 1/3287 | (2019.01) |
| H01R 31/06 | (2006.01) |

(52) U.S. Cl.
CPC .............. *G06F 1/263* (2013.01); *G06F 1/189* (2013.01); *G06F 1/266* (2013.01); *G06F 1/305* (2013.01); *G06F 1/3287* (2013.01); *H01R 31/06* (2013.01); *H02J 9/061* (2013.01); *H05K 7/1492* (2013.01)

(58) Field of Classification Search
CPC ................................. G06F 1/189; G06F 1/263
See application file for complete search history.

(56) References Cited

U.S. PATENT DOCUMENTS

| | | | |
|---|---|---|---|
| 9,122,466 B1 * | 9/2015 | Kellett | G06F 1/26 |
| 2007/0025090 A1 * | 2/2007 | Belady | G06F 1/189 |
| | | | 361/724 |
| 2019/0074668 A1 * | 3/2019 | Huang | G06F 1/189 |

OTHER PUBLICATIONS

U.S. Appl. No. 15/628,010, filed Jun. 20, 2017, Mike MacGregor.
U.S. Appl. No. 15/608,728, filed May 30, 2017, Wildstone, et al.
Liteon, "Datasheet," Lite-On Power System Solutions, Dec. 2016, pp. 1-10.
Liteon; Power System Solutions, "Are you buying technology that you already own?," downloaded on Mar. 15, 2017, pp. 1-8.

\* cited by examiner

*Primary Examiner* — Albert Wang
(74) *Attorney, Agent, or Firm* — Robert C. Kowert; Meyertons, Hood, Kivlin, Kowert & Goetzel, P.C (57) ABSTRACT

A method for migrating a power shelf between being supplied single-phase power and three-phase power includes coupling a second power adapter to an input of a power shelf of a rack while power is being supplied to the power shelf via a first power adapter coupled to another input of the power shelf. The first power adapter includes a multi-pin connector coupled to the input and three other connectors each coupled to respective single-phase power sources and the second power adapter includes a multi-pin connector configured to couple with the other input and another connector configured to couple with a three-phase power source.

20 Claims, 7 Drawing Sheets

RACK POWER SHELF MIGRATION BETWEEN SINGLE-PHASE AND THREE-PHASE POWER

BACKGROUND

In some computing facilities, each server in a rack may include its own power supply that converts higher voltage alternating current power into lower voltage direct current power suitable for consumption by computing devices included in the servers. Other computing facilities may include computing devices, such as servers, mounted in a rack that include a common power supply mounted in the rack. The common power supply may convert higher voltage alternating current power into lower voltage direct current power suitable for consumption by the computing devices of the servers mounted in the rack.

Conventionally power supplies mounted in a rack are configured to receive single-phase electrical power. However, such power supplies and power distribution systems, that provide power to such power supplies, may not be configured to receive three-phase power. Furthermore, a power distribution system may be configured such that changing power sources for the power supplies from a single-phase power source to a three-phase power source requires downstream loads that receive power from the power supplies to lose power. This may result in significant downtime and interruption of services in a computing facility, such as a data center.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims. The headings used herein are for organizational purposes only and are not meant to be used to limit the scope of the description or the claims. As used throughout this application, the word "may" is used in a permissive sense (i.e., meaning having the potential to), rather than the mandatory sense (i.e., meaning must). Similarly, the words "include," "including," and "includes" mean including, but not limited to.

DETAILED DESCRIPTION OF EMBODIMENTS

Various embodiments of systems and methods for migrating a rack power shelf between being supplied single-phase power and being supplied three-phase power are disclosed. According to one embodiment a method includes coupling a second power adapter to a secondary input of a power shelf mounted in a rack while power is being supplied to the power shelf via a first power adapter coupled to a primary input of the power shelf, wherein the power shelf supplies power received at the primary input or the secondary input to one or more electrical loads in the rack. The second power adapter comprises a multi-pin connector configured to couple with the secondary input of the power shelf and another connector configured to couple with a three-phase power source. Also, the first power adapter comprises a multi-pin connector coupled to the primary input of the power shelf and three other connectors each coupled to respective single-phase power sources. The method further includes, while power is being supplied to the one or more electrical loads, disconnecting the first power adapter from the primary input of the power shelf and coupling a third power adapter to the primary input of the power shelf, wherein the third power adapter comprises a multi-pin connector configured to couple with the primary input and another connector configured to couple with a three-phase power source. In some embodiments, single-phase power may be supplied to the power shelf via the first power adapter coupled to the primary input while the second power adapter is being coupled to the secondary input. Also, while the first power adapter is disconnected from the primary input and while the third power adapter (coupled to a three-phase source) is being coupled to the primary input, three-phase power may be supplied to the power shelf via the second power adapter coupled to the secondary input. Also, in some embodiments, a power shelf may include one or more batteries, and power may be supplied to one or more electrical loads that receive power from the power shelf from the one or more batteries while the first power adapter is disconnected from the primary input and before power is supplied to the primary input via the third power adapter.

According to one embodiment, a method comprises supplying power to a rack power shelf from three single-phase power sources via a power adapter comprising a multi-pin connector at a first end and three connectors at a second end, wherein each of the three connectors are configured to couple to respective ones of the three single-phase power sources. The method also comprises supplying power to the rack power shelf from a three-phase power source via another power adapter comprising a multi-pin connector at a first end and another connector at a second end configured to couple to the three-phase power source.

According to one embodiment, a system includes a plurality of computing devices mounted in a rack and a power shelf configured to supply power to the plurality of computing devices. The system also includes a first power adapter comprising a multi-pin connector at a first end of the first power adapter and three connectors at a second end of the first power adapter, wherein each of the three connectors are configured to couple to a respective single-phase power source. Additionally, the system includes a second power adapter comprising a multi-pin connector at a first end of the second power adapter and a connector at a second end of the second power adapter configured to couple to a three-phase power source. Also, the power shelf is configured to receive three-phase power via the second power adapter and is configured to receive three single-phase power inputs via the first power adapter.

As used herein, a "computing device" includes any of various computer systems or components thereof. One example of a computing device is a rack-mounted server. As used herein, the term computer is not limited to just those integrated circuits referred to in the art as a computer, but broadly refers to a processor, a server, a microcontroller, a microcomputer, a programmable logic controller (PLC), an application specific integrated circuit, and other programmable circuits, and these terms are used interchangeably herein. In the various embodiments, memory may include, but is not limited to, a computer-readable medium, such as a random access memory (RAM). Alternatively, a compact disc-read only memory (CD-ROM), a magneto-optical disk (MOD), and/or a digital versatile disc (DVD) may also be used.

As used herein, "data center" includes any facility or portion of a facility in which computer operations are carried out. A data center may include servers dedicated to specific functions or serving multiple functions. Examples of computer operations include information processing, communications, testing, simulations, power distribution and control, and operational control.

As used herein, "power distribution system" means any device, module, component, or combination thereof, that can be used to distribute electrical power.

As used herein, a "rack" means a rack, container, frame, or other element or combination of elements that can contain or physically support one or more electrical devices.

Some facilities, such as data centers, may include multiple racks each comprising computing devices, such as servers, networking equipment, or other types of electronic equipment. In such facilities, single-phase power may be distributed to power supplies mounted in the racks or to power supplies mounted in the computing devices, networking devices, or other pieces of electronic equipment themselves. However, in either case, migrating the racks to receive three-phase power may require significant downtime and loss of use of the computing devices, networking equipment, or other electronic equipment mounted in the racks. Also, in large data centers comprising hundreds or thousands of racks, downtime due to migration between single-phase and three-phase power may result in an interruption of services offered to customers of the data center, loss of redundancy, or other undesirable interruptions.

In some embodiments, migration between single-phase power and three-phase power being supplied to a rack may be performed without loss of operation or downtime of computing devices, networking devices, or other electrical equipment mounted in the rack. In some embodiments, a rack comprising a power shelf may be installed in a data center, and the power shelf may comprise multiple internal single-phase power distribution systems referred to herein as "neutral domains." Also, the power shelf may comprise a primary input and a secondary input, wherein both the primary and secondary input comprise multi-pin connectors. Respective sets of pins of the multi-pin connectors may be connected to power supplies in separate ones of the isolated neutral domains of the power shelf. For example, a power shelf may include three neutral domains with three sets of power supplies mounted in respective ones of the neutral domains. Each of the sets of power supplies may be coupled to a separate set of pins of the respective multi-pin connectors, such that the separate sets of power supplies are coupled in isolated neutral domains. For example, each multi-pin connector of the power shelf (e.g. both primary and secondary) may include a first live pin and a first neutral pin that are connected to power supplies in a first neutral domain of the power shelf via a backplane of the power shelf, a second live pin and a second neutral pin that are connected to power supplies in a second neutral domain of the power shelf via the backplane of the power shelf, and a third live pin and a third neutral pin that are connected to power supplies in a third neutral domain of the power shelf via the backplane of the power shelf. Additionally, each multi-pin connector of the power shelf may also include a ground pin that provides a grounding path from each of the three neutral domains.

While single-phase-power is being supplied to a power shelf, power supplies in each neutral domain of the power shelf may receive single-phase power from a separate single-phase power source via a first power adapter coupled to a multi-pin connector of the power shelf. The first power adapter may comprise a multi-pin connector at a first end of the first power adapter configured to couple with one of the multi-pin connectors of the power shelf. The first power adapter may also comprise three connectors at a second end of the first power adapter, wherein each of the three connectors are configured to couple to respective single-phase power sources. Moreover, because the pins of the respective multi-pin connectors of the power shelf are connected to power supplies in three different respective neutral domains of the power shelf, single-phase power from the three single-phase power connectors may be supplied to the power supplies in the different respective neutral domains without causing short circuits or other issues related to different upstream power infrastructure sharing a common neutral.

When three-phase power is available to be supplied to the power shelf and a determination is made to supply three-phase power to the power shelf, the power shelf may be migrated from receiving single-phase power to receiving three-phase power while computing devices, networking devices, and other pieces of electrical equipment mounted in the rack comprising the power shelf remain in operation. For example, a second power adapter comprising a multi-pin connector at a first end of the second power adapter and a connector at a second end of the second power adapter configured to couple to a three-phase power source may be coupled to the multi-pin connector of the secondary input of the power shelf. This may be done while single-phase power continues to be supplied to the power shelf via the primary input and continues to be routed in the power shelf to the power supplies in the respective neutral domains of the power shelf, wherein power from the power supplies is in turn supplied to computing devices, networking devices, or other pieces of electrical equipment mounted in the rack comprising the power shelf.

After the second power adapter is coupled to the secondary input of the power shelf, a three-phase power source may be energized to supply power to the secondary input of the power shelf via the second power adapter. Also, the single-phase power sources may be de-energized and the first power adapter may be disconnected from the primary input of the power shelf. In some embodiments, a breaker or other power control device may be used to de-energize the single-phase power sources. In other embodiments, depending on voltage of the single-phase power sources, the first power adapter may be disconnected from the primary input without opening a breaker or other power control device. After the first power adapter is disconnected from the primary input, the power shelf may continue to supply power to one or more electrical loads (e.g. computing devices, networking devices, etc.) in the rack that receive power from the power shelf by feeding power from one or more batteries of the power shelf or by receiving power from the secondary input of the power shelf via the second power adapter coupled to the three-phase power source.

Even though the phases of the three-phase power source may be synchronized and come from a common power source each of the three-phases may be fed to power supplies in a different respective isolated neutral domain of the power shelf in a similar manner as the three separate single-phase power sources. Such an arrangement, while not necessary when receiving synchronized three-phase power from a single source may not negatively impact operation of the power shelf and may allow either single-phase power or three-phase power to be supplied to the power shelf using the same hardware components of the power shelf, while only requiring different power adapters to receive single-phase or three-phase power. For example, the power shelf may include a backplane that segregates power received from different sets of live and neutral pins of the multi-pin connectors of the primary or secondary inputs and the multi-pin connectors may be configured to couple with a power adapter that couples with a single-phase power source or a power adapter that couples with a three-phase power source.

After the first power adapter is disconnected from the primary input of the power shelf, and while power is being supplied to the one or more electrical loads in the rack from a battery of the power shelf or from a three-phase power source coupled to the secondary power input of the power shelf via power supplies of the power shelf, a third power adapter comprising a multi-pin connector configured to couple with the primary input and another connector configured to couple with a three-phase power source may be coupled to the primary power input of the power shelf. Thus, the power shelf may have a power adapter coupled to a three-phase power source coupled to the secondary input and a power adapter coupled to a three-phase power source coupled to the primary input. Once the third power adapter is coupled to the primary input, the primary input may be energized by closing a breaker or otherwise allowing three-phase power to flow to the primary input via the third power adapter.

At this point, the power shelf has been migrated from being supplied single-phase power to instead being supplied three-phase power at both a primary input and a secondary input.

Figure 1:
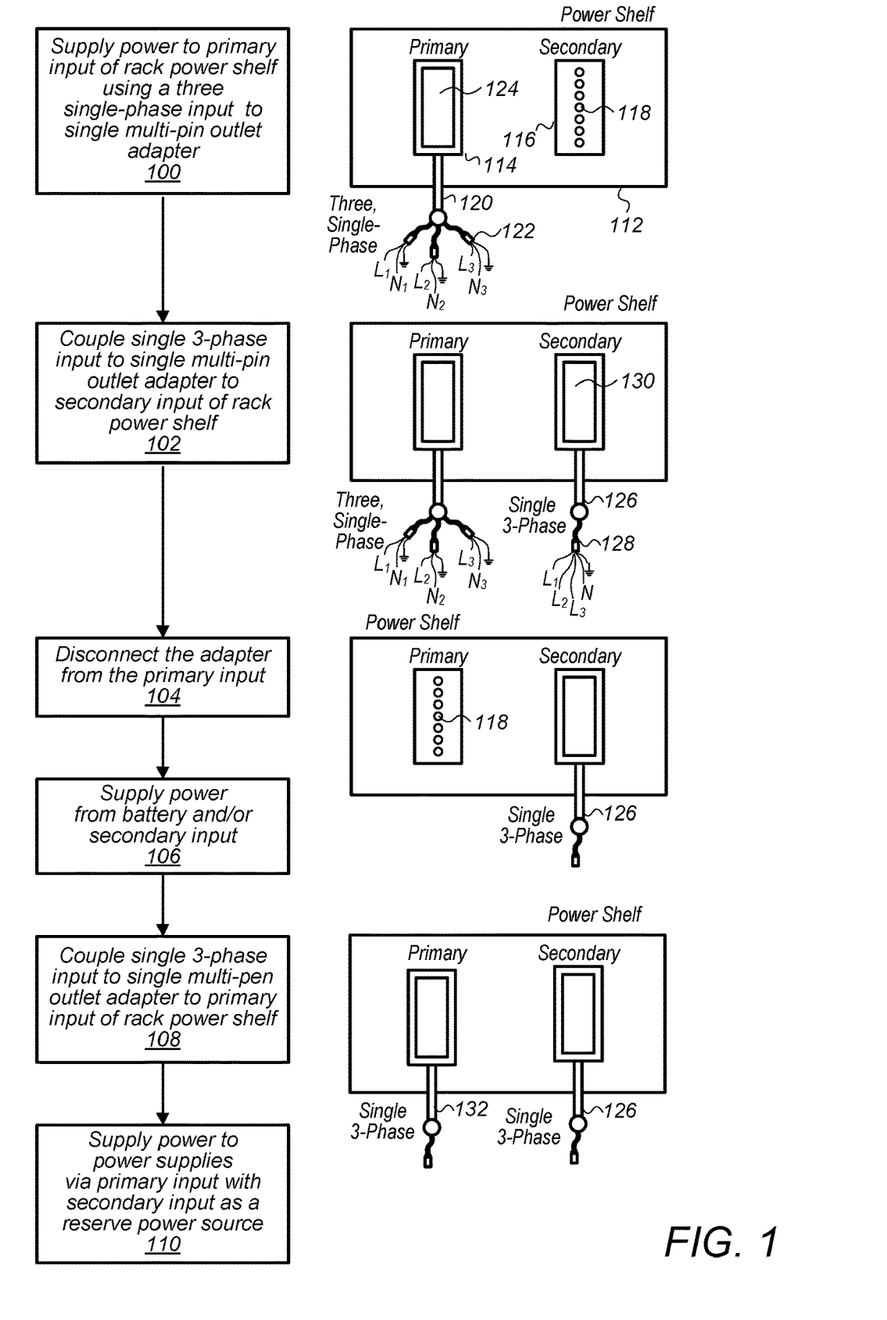
FIG. 1 is a flowchart with accompanying diagrams illustrating migration of a power shelf from single-phase power to three-phase power, according to some embodiments.

FIG. 1 is a flowchart with accompanying diagrams illustrating live migration of a power shelf from single-phase power to three-phase power, according to some embodiments.

At 100, single-phase power is supplied to a primary input of a power shelf via a first power adapter comprising three single-phase power connectors at one end of the first power adapter and a multi-pin connector at another end of the first power adapter, wherein the multi-pin connector of the first power adapter is configured to couple with a corresponding multi-pin connector of the primary input of the power shelf.

For example, power shelf 112 comprises primary input 114 and secondary input 116. Both primary input 114 and secondary input 116 of power shelf 112 include multi-pin connectors 118. In some embodiments, a multi-pin connector, such as multi-pin connector 118, may include seven pins, a first live pin and a first neutral pin that are connected to power supplies in a first neutral domain, a second live pin and a second neutral pin that are connected to power supplies in a second neutral domain, a third live pin and a third neutral pin that are connected to power supplies in a third neutral domain, and a ground pin that provides a grounding path for power supplies in each of the three neutral domains. Also, a first power adapter, such as power adapter 120, may comprise three single-phase connectors at one end of the first power adapter, such as single-phase connectors 122. Each of the single-phase connectors may include a live wire connection, a neutral wire connection, and a ground wire connection as shown in FIG. 1 for single-phase connectors 122 of power adapter 120. A power adapter, such as power adapter 120, may also include a multi-pin connector, such as multi-pin connector 124 (shown connected to primary input 114 of power shelf 112). Also, a first power adapter, such as power adapter 120, may maintain separate neutral domains between the single-phase connectors of the power adapter and the multi-pin connector of the power adapter.

For example, power adapter 120 may comprise isolated connections between sets of pins of a multi-pin connector 124 and separate ones of the single-phase connectors 122. For example, L1 and N1 of a first single-phase connector 122 may be connected to a first live pin and a first neutral pin of multi-pin connector 124. Also, L2 and N2 of a second single-phase connector 122 may be connected to a second live pin and a second neutral pin of multi-pin connector 124. Additionally, L3 and N3 of a third single-phase connector 122 may be connected to a third live pin and a third neutral pin of a multi-pin connector 124. In each case, power adapter 120 may isolate electrical flow paths between single-phase connectors and corresponding pins of a multi-pin connector so that there are not electrical paths across neutral domains. Additionally, a first power adapter, such as power adapter 120, may connect a ground pin of a multi-pin connector, such as a ground pin of multi-pin connector 124 to one or more of the ground connections of the single-phase connectors, such as ground connections of single-phase connectors 122.

At 102, a second power adapter configured to receive three-phase power and configured to couple to a multi-pin connector of a power shelf is coupled to a secondary input of the power shelf.

For example, power adapter 126 is coupled to secondary input 116 of power shelf 112. In some embodiments, a second power adapter, such as power adapter 126, comprises a multi-pin connector at one end of the second power adapter and a three-phase power connector at another end of the second power adapter. In some embodiments, the multi-pin connector may comprise seven pins. For example, the pins of a multi-pin connector of a second power adapter, such as multi-pin connector 130 of power adapter 126, may comprise a first live pin and a first neutral pin, a second live pin and a second neutral pin, a third live pin and a third neutral pin, and a ground pin. A three-phase connector of a second power adapter, such as three-phase connector 128 of power adapter 126, may comprise three live connectors, a neutral connector, and a ground connector. Each of the live connectors may be electrically coupled to corresponding live pins of a multi-pin connector of the second power adapter, such as multi-pin connector 130 (shown coupled to secondary input 116 of power shelf 112) of power adapter 126. A neutral connection of a three-phase connector of a second power adapter may be electrically coupled to multiple neutral pins of a multi-pin connector of the second power adapter. For example, the neutral connection of three-phase connector 128 of power adapter 126 may be electrically coupled to a first, second, and third neutral pin of multi-pin connector 130 of power adapter 126. Note that because power adapter 126 is configured to receive three-phase power via three-phase connector 128 and because phases of three-phase power are from a common power source, the three live connections of three-phase connector 128 may share a common neutral connection.

At 104, the first power adapter is disconnected from the primary input of the power shelf. For example, power adapter 120 is disconnected from primary input 114 of power shelf 112. In some embodiments, depending on voltage, a first power adapter may be disconnected while energized, or a power source to a first power adapter may be stopped, for example, by opening a breaker or switch, before disconnecting a first power adapter, such as power adapter 120.

At 106, while no power source is connected to the primary input of the power shelf, the power shelf may supply power to one or more electrical loads in a rack that receive power from the power shelf from a battery of the power shelf or a battery coupled to the power shelf. In some embodiments, a power shelf may additionally or alternatively receive three-phase power via the secondary input of the power shelf via the second power adapter coupled to the secondary input while no power source is connected to the primary input of the power shelf. This power may be routed to power supplies of the power shelf that in turn provide power to one or more electrical loads in a rack that comprises the power shelf. In some embodiments, a power shelf may comprise power supplies comprising an automatic transfer switch configured to selectively switch from receiving power via the primary input of the power shelf to instead receive power via the secondary input of the power shelf. In some embodiments, an automatic transfer switching feature of a power supply may be in a switching disabled mode when a secondary power source is not coupled to a secondary input of a power shelf. In some embodiments, an automatic transfer switching feature of a power supply may automatically be enabled when a power source is connected to a secondary input of a power shelf. Alternatively, in some embodiments, an additional step of enabling an automatic transfer switching mode of one or more power supplies may be performed prior to disconnecting the first power adapter from the primary input of the power shelf at 104. In some embodiments, an automatic transfer switch may be included in a power shelf between the primary and secondary inputs of the power shelf and one or more power supplies of the power shelf, in such an embodiment the automatic transfer switch may also be in a switching disabled mode when a power source is not connected to a secondary input of the power shelf and may be manually or automatically switched to a switching enabled mode when a power source is connected to the secondary input of the power shelf.

At 108, a third power adapter is coupled to the primary input of the power shelf. The third power adapter comprises a three-phase power connector configured to couple with a three-phase power source and comprises a multi-pin connector configured to couple with the primary input of the power shelf. For example, three-phase power adapter 132 is coupled to primary input 114. Three-phase power adapter 132 may be a similar power adapter as three-phase power adapter 126. At this point three-phase power adapters 132 and 126 are respectively coupled to primary input 114 and secondary input 116 of power shelf 112. Thus the power shelf has been migrated to receive three-phase power. Once a three-phase power adapter, such as power adapter 132, is coupled to the primary input of the power shelf, such as primary input 114, the three-phase power adapter may be energized, for example by closing a breaker or switch, and three-phase power may be supplied to the power shelf via the primary power input.

For example, at 110 three-phase power is supplied to power supplies of the power shelf via the third power adapter coupled to the primary input of the power shelf. Also, the secondary input, also coupled to a three-phase power source, acts as a reserve power source for the power supplies of the power shelf.

Figures 2A, 2B:
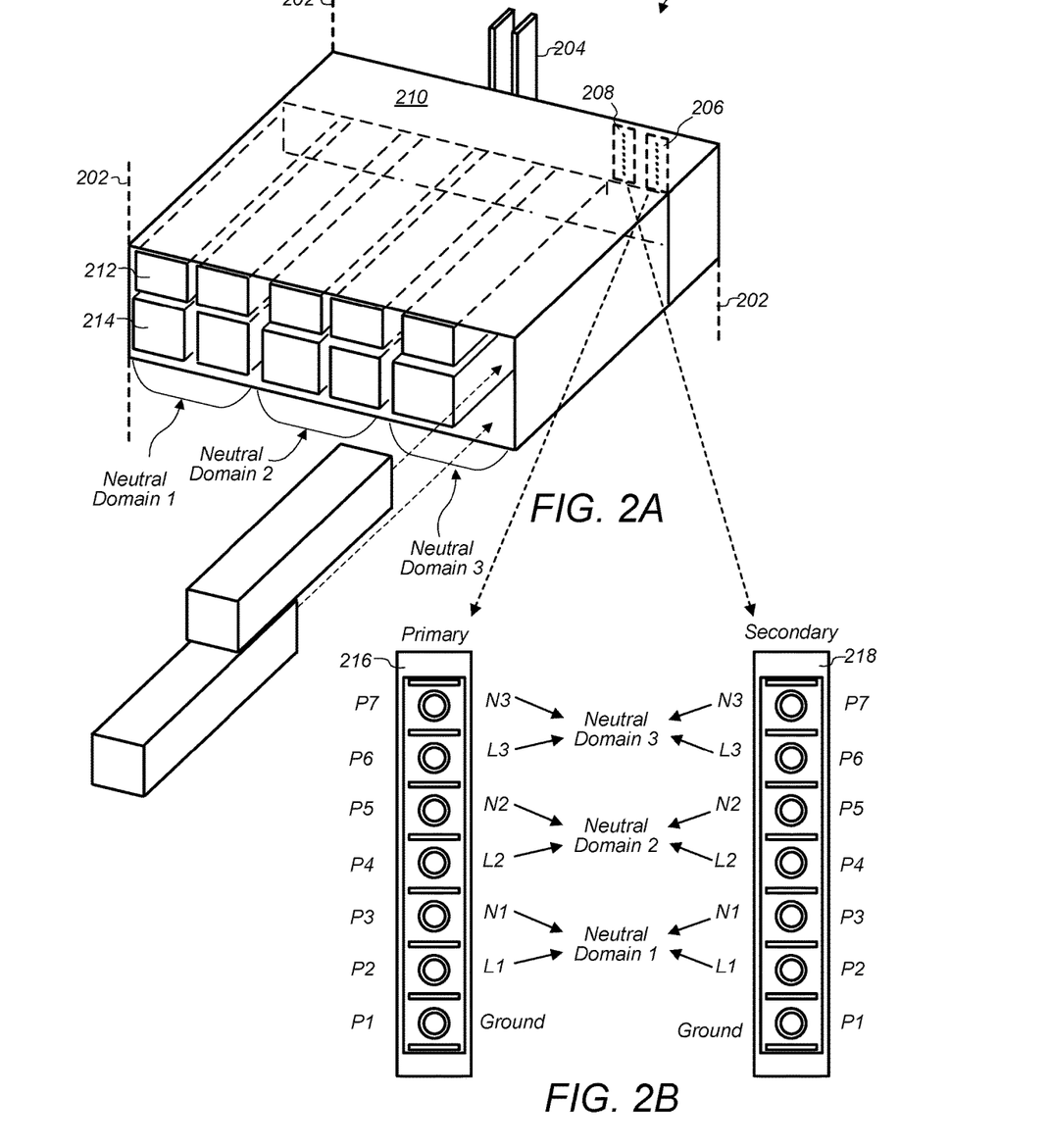
FIG. 2A is a schematic diagram illustrating a perspective view of a power shelf, according to some embodiments.
FIG. 2B illustrates a more detailed view of multi-pin connectors and neutral domains of a power shelf, according to some embodiments.

FIG. 2A is a schematic diagram illustrating a perspective view of a power shelf, according to some embodiments.

Power shelf 200 illustrated in FIG. 2A may be a similar power shelf as power shelf 112 illustrated in FIG. 1. Power shelf 200 is mounted in a rack 202 and supplies DC power to electrical loads mounted in rack 202 via DC bus bars 204 mounted at the rear of power shelf 200. Also, power shelf 200 comprises primary input 206 and secondary input 208 at the rear of power shelf 200. In some embodiments, a primary input and a secondary input of a power shelf may be mounted on a front of the power shelf or at another position on the power shelf. Each of the primary input and the secondary input of a power shelf, such as primary input 206 and secondary input 208, may include a multi-pin connector that includes different sets of pins that are coupled to power supplies in different neutral domains of a power shelf. For example, a first set of pins of a primary or secondary input of a power shelf, such as primary input 206 or secondary input 208, may comprise a first live pin and a first neutral pin. The first live pin and the first neutral pin may be coupled via a backplane of the power shelf, such as backplane 210, to a first isolated neutral domain of the power shelf, such as neutral domain 1. The first isolated neutral domain may comprise one or more power supplies, such as power supplies 212. The power supplies may receive alternating current power supplied to the power supplies and convert the alternating current power into lower voltage direct current power suitable for consumption by electrical loads mounted in the rack, such as computing devices, networking devices, or other electrical equipment. In a similar manner, other respective live and neutral pins of a multi-pin connector of a power shelf may receive power that is routed to the other respective neutral domains.

For example, when a power adapter comprising three separate single-phase connectors coupled to three single-phase power sources is being used to supply power to the power shelf, single-phase power from one of the single-phase power sources may be supplied to the first neutral domain, while single-phase power from other ones of the single-phase power sources are fed to the other respective neutral domains.

When a power adapter comprising a three-phase power connection is being used to supply power to a power shelf from a three-phase power source, one of the three-phases may be supplied to the first neutral domain, while other ones of the phases are fed to the other respective neutral domains.

FIG. 2B illustrates a more detailed view of multi-pin connectors and neutral domains of a power shelf, according to some embodiments. Primary input 206 may include multi-pin connector 216 and secondary input 208 may include multi-pin connector 218. In some embodiments, a multi-pin connector, such as multi-pin connector 216 or 218, may comprise seven pins. However, in some embodiments a multi-pin connector may include more or fewer pins. For example, in some embodiments, a multi-pin connector may include a separate ground pin for each neutral domain, thus resulting in a nine pin connector. As another example, in some embodiments, a grounding path may be separate from a multi-pin connector, thus a multi-pin connector may include only six pins in such embodiments.

In embodiments, wherein a multi-pin connector comprises seven pins, sets of live and neutral pins may be coupled to respective neutral domains and a common grounding pin may provide a grounding path for multiple neutral domains. For example, multi-pin connector 216 of primary input 206 includes live pin 2 and neutral pin 3 that are coupled to power supplies in neutral domain 1 and that are configured to couple with a live pin and a neutral pin of a power adapter with a multi-pin connector. Multi-pin connector 216 also includes pins 4 and 5 that are coupled to power supplies in neutral domain 2 and that are configured to couple with another live pin and another neutral pin of a multi-pin connector of a power adapter. Multi-pin connector 216 also includes pins 6 and 7 that are coupled to power supplies in neutral domain 3 and that are configured to couple with yet another live pin and neutral pin of a multi-pin connector of a power adapter. Additionally, multi-pin connector 216 includes pin 1 that is coupled to a grounding path for power supplies in each of neutral domains 1, 2, and 3 and that is configured to couple with a ground pin of a multi-pin connector of a power adapter. Note that while the power adapters and power shelves described herein are described in terms of having multi-pin connectors, in some embodiments, other suitable types of connectors may be used. For example, in some embodiments each pin described herein may be connected to one or more power adapters via separate connectors or the pins described herein may be grouped into sets of pins spread across more than one multi-pin connector. Also, in some embodiments, other types of connectors may be used.

In some embodiments, in addition to comprising power supplies, a power shelf may comprises one or more batteries, such as batteries 214. In some embodiments, batteries of a power shelf may be charged when power is available at a primary input (or secondary input) of the power shelf and may supply power to downstream loads in response to a loss of power at a primary (or secondary) input of a power shelf. In some embodiments, batteries may be associated with a set of power supplies in a given neutral domain. For example neutral domain 1 may include one or more power supplies and one or more batteries. In some embodiments, batteries may be configured to be charged by power supplied to a particular neutral domain, but may be configured to supply DC power to a common DC power bus that supplies power to electrical loads in the rack from power supplies located in multiple neutral domains.

In some embodiments, power supplies, such as power supplies 212, may comprise automatic transfer switches configured to automatically switch between receiving power from a primary input, such as primary input 206, or a secondary input, such as secondary input 208. In some embodiments, power supplies without automatic transfer switches may initially be installed in a power shelf and may be replaced with power supplies with automatic transfer switches. In some embodiments, power supplies with and without automatic transfer switches may have a same or similar form factor. In some embodiments, power supplies without automatic transfer switches may be initially installed in a power shelf in a data center that does not include both primary and secondary power sources available to couple to a power shelf. In such situations, in response to the data center being upgraded to supply both primary and secondary power to a rack, the power supplies of the power shelf may be replaced with power supplies that include automatic transfer switches. In some embodiments, a secondary power source being made available at the rack may coincide with power supplied to the rack being migrated from single-phase power to three-phase power. In such situations, replacing non-ATS power supplies with ATS power supplies may be included as a step in a process of migrating a power shelf from being supplied single-phase power to being supplied three-phase power. Additionally, in some embodiments, batteries, such as batteries 214, may be added to a power shelf, if not already included in the power shelf.

Figure 3:
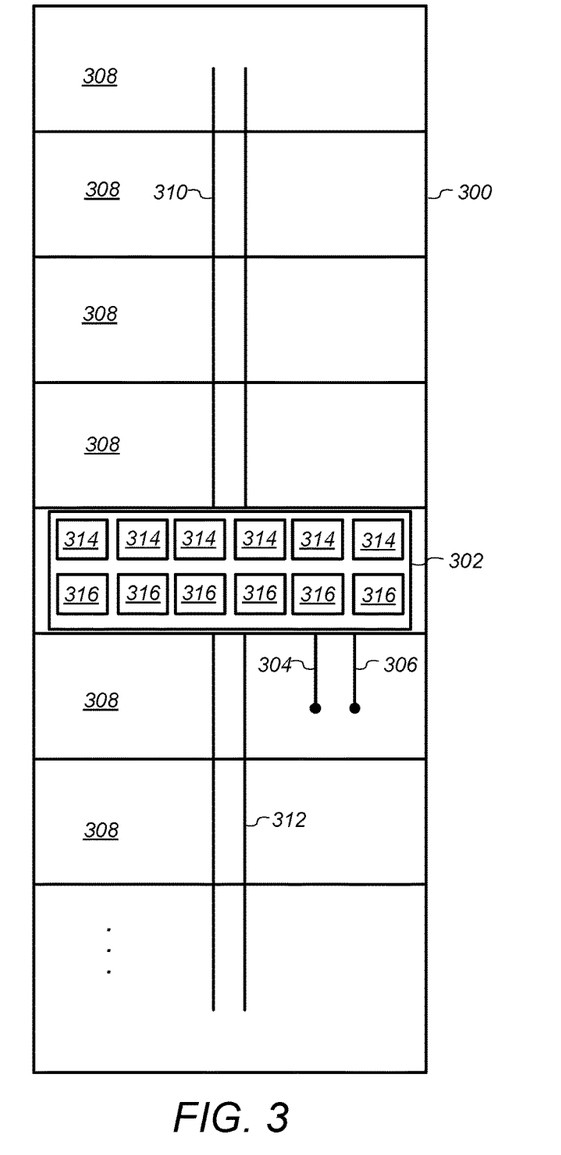
FIG. 3 is a schematic diagram illustrating a front view of a rack comprising a power shelf, according to some embodiments.

FIG. 3 is a schematic diagram illustrating a front view of a rack comprising a power shelf, according to some embodiments.

Power shelf 302 included in rack 300 may be a similar power shelf as power shelf 112 illustrated in FIG. 1 or power shelf 200 illustrated in FIG. 2. Power shelf 302 may receive power from either single-phase power sources or a three-phase power source at power connections 304 or 306, which may comprise a single-phase power adapter such as power adapter 120 illustrated in FIG. 1 or a three-phase power adapter, such as power adapter 126 or 132 illustrated in FIG. 1.

A power shelf, such as power shelf 302, may supply DC power to electrical loads mounted in a rack via one or more DC bus bars. For example, power supplies 314 of power shelf 302 convert either single-phase or three-phase AC power received via power connections 304 and/or 306 into DC power that is supplied to loads 308 via DC bus bars 310 and 312. In some embodiments, a power shelf, such as power shelf 302, may further comprise one or more batteries, such as batteries 316, configured to supply DC power to DC bus bars, such as DC bus bars 310 and 312. In some embodiments, a power shelf, such as power shelf 302, could include more or less batteries, such as batteries 306. In some embodiments, batteries 306 may be located in a location adjacent to rack 300 or power shelf 302, but may not be included in rack 300 or power shelf 302.

Figures 4A, 4B, 4C:
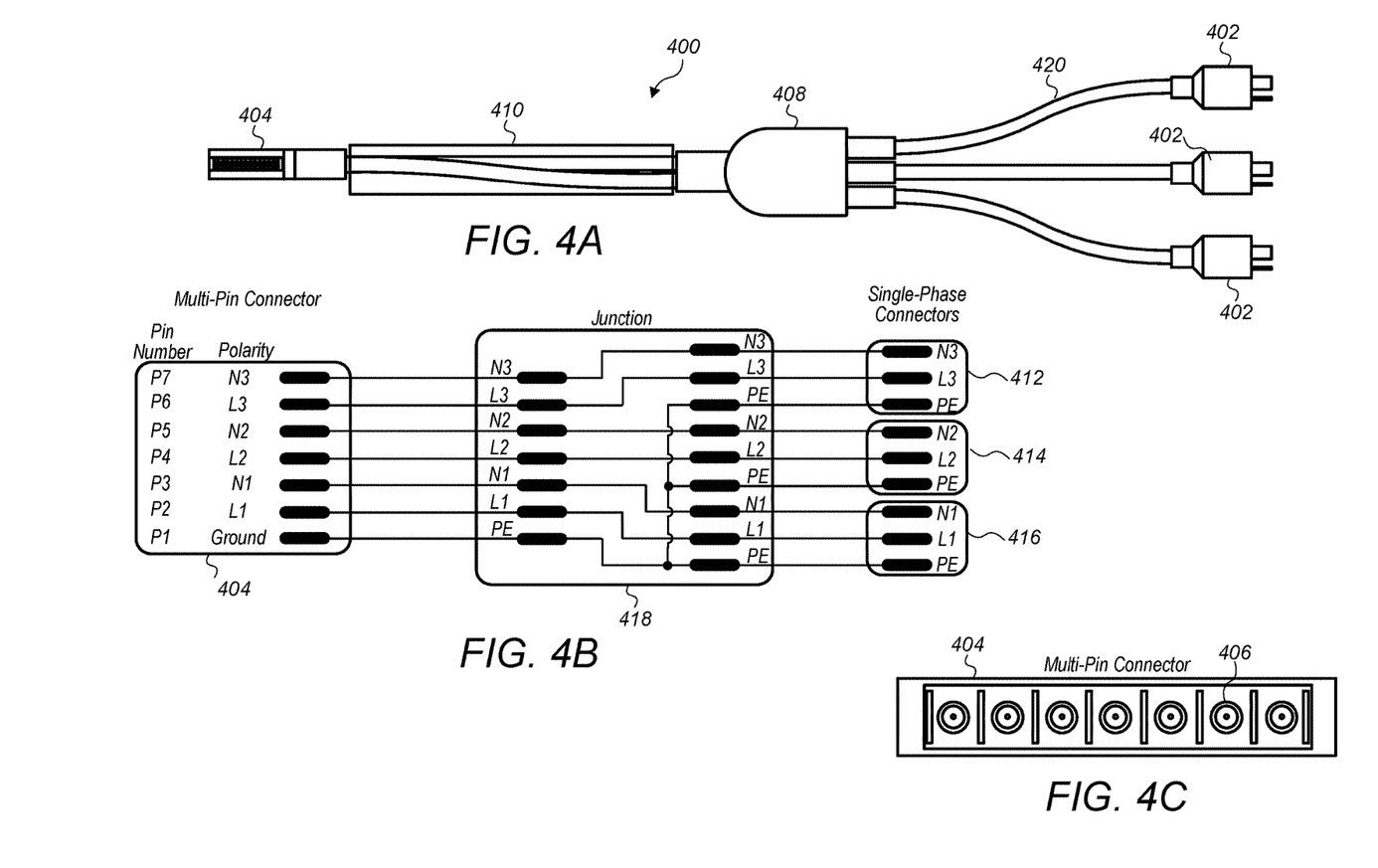
FIG. 4A is a schematic diagram illustrating a single-phase to multi-pin power adapter, according to some embodiments.
FIG. 4B is a line diagram illustrating electrical paths of a single-phase to multi-pin power adapter, according to some embodiments.
FIG. 4C is a more detailed view of a multi-pin connector of a single-phase to multi-pin power adapter, according to some embodiments.

FIG. 4A is a schematic diagram illustrating a single-phase to multi-pin power adapter, according to some embodiments. Power adapter 400 illustrated in FIG. 4 may be a similar power adapter as power adapter 120 illustrated in FIG. 1.

Power adapter 400 includes three single-phase connectors 402 at a first end of the power adapter and a multi-pin connector 404 at a second end of the power adapter. In some embodiments, a single-phase connector, such as one of single-phase connectors 402, may comprise a L6-30A plug, an IEC 309-32A plug, or other suitable type of connector. In some embodiments, a multi-pin connector, such as multi-pin connector 404, may comprise a Positronic seven pin plug, or other suitable connector. Power adapter 400 also includes cables 420 that connect respective ones of single-phase connectors 402 to junction 408 and one or more additional cables 410 that connect junction 408 to multi-pin connector 404.

FIG. 4B is a line diagram illustrating electrical paths of a single-phase to multi-pin power adapter, according to some embodiments, and FIG. 4C is a more detailed view of a multi-pin connector of a single-phase to multi-pin power adapter, according to some embodiments. Multi-pin connector 404 illustrated in FIG. 4C includes seven pins 406. In some embodiments, a multi-pin connector, such as multi-pin connector 404, may include male or female components configured to couple with corresponding male or female components of a multi-pin connector of a power shelf, such as primary input 114 or secondary input 116 of power shelf 112 illustrated in FIG. 1, multi-pin connector 216 of primary input 206 or multi-pin connector 218 of secondary input 208 of power shelf 200 illustrated in FIG. 2, or primary or secondary inputs of power shelf 302 illustrated in FIG. 3. Each of the pins 406 is shown in the line diagram shown in FIG. 4B. For example, multi-pin connector 404 includes pins number 1-7. Pin 1 has a ground or "protective earth (PE)" polarity. Pins 2 and 3 may be a set of pins that connect to a first neutral domain of a power shelf and have a live 1 polarity and neutral 1 polarity. Pins 4 and 5 may be a set of pins that connect to a second neutral domain of a power shelf and have a live 2 polarity and a neutral 2 polarity. Pins 6 and 7 may be another set of pins that connect to a third neutral domain of a power shelf and have a live 3 and neutral 3 polarity.

Pins 2 and 3 may be connected to single-phase connector 1 (416) that couples with a first single-phase power source. Pins 4 and 5 may be connected to single-phase connector 2 (414) that couples with a second single-phase power source. And, pins 6 and 7 may be connected to single-phase connector 3 (412) that couples to a third single-phase power source. As can be seen in FIG. 4B, lines connecting connectors 412, 414, and 416 may maintain separate neutral domains between the single-phase connectors of the power adapter and the multi-pin connector of the power adapter. Additionally, a junction, such as junction 418 (a more detailed view of junction 408), may combine the ground connections from each of the single-phase connectors 412, 414, and 416 into a common ground pin of multi-pin connector 404. In some embodiments, a multi-pin connector, such as multi-pin connector 404, may comprise or be configured to accept retention screws to secure the multi-pin connector to a power shelf.

Figure 5A:
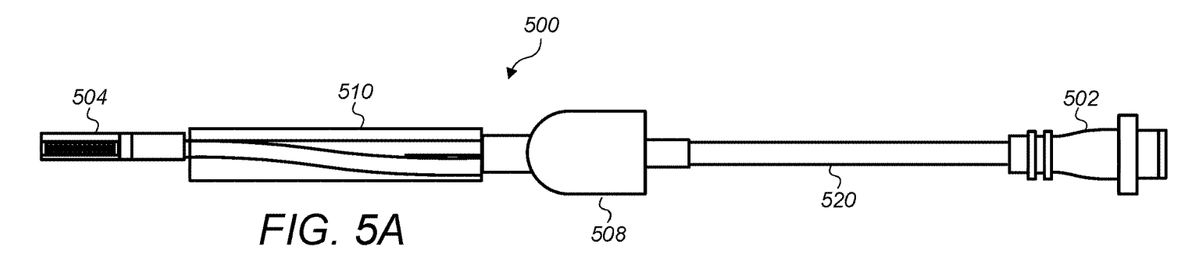
FIG. 5A is a schematic diagram illustrating a three-phase to multi-pin power adapter, according to some embodiments.

FIG. 5A is a schematic diagram illustrating a three-phase to multi-pin power adapter, according to some embodiments. Power adapter 500 illustrated in FIG. 5 may be a similar power adapter as power adapter 126 or 132 illustrated in FIG. 1.

Power adapter 500 includes a single three-phase connector 502 at a first end of the power adapter and a multi-pin connector 504 at a second end of the power adapter. In some embodiments, a three-phase connector may be a 415V three-phase connector, a 418V three-phase connector, or other suitable type of connector. In some embodiments, a multi-pin connector, such as multi-pin connector 504, may comprise a Positronic seven pin plug, or other suitable connector. Power adapter 500 also includes cables 520 that connect three-phase connector 502 to junction 508 and one or more additional cables 510 that connect junction 508 to multi-pin connector 504.

Figure 5B:
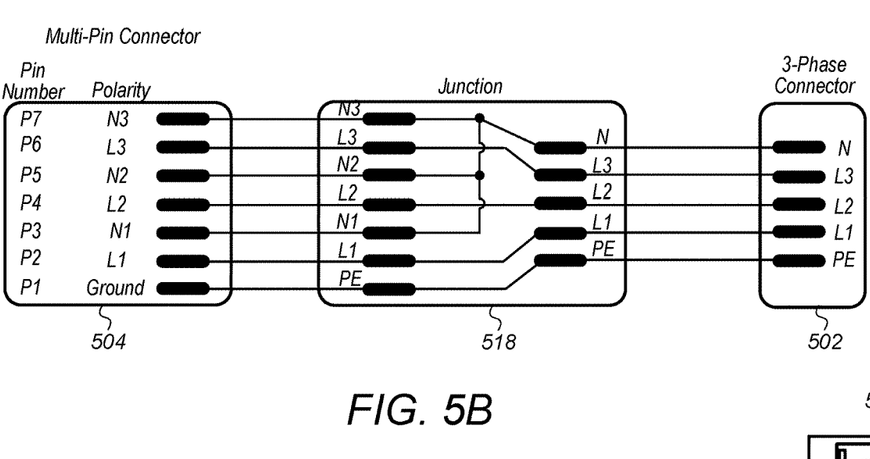
FIG. 5B is a line diagram illustrating electrical paths of a three-phase to multi-pin power adapter, according to some embodiments.
Figure 5C:
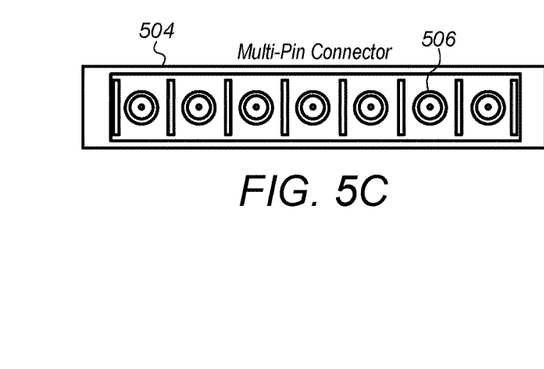
FIG. 5C is a more detailed view of a multi-pin connector of a three-phase to multi-pin power adapter, according to some embodiments.

FIG. 5B is a line diagram illustrating electrical paths of a three-phase to multi-pin power adapter, according to some embodiments, and FIG. 5C is a more detailed view of a multi-pin connector of a three-phase to multi-pin power adapter, according to some embodiments. Multi-pin connector 504 illustrated in FIG. 5C includes seven pins 506. In some embodiments, a multi-pin connector, such as multi-pin connector 504, may include male or female components configured to couple with corresponding male or female components of a multi-pin connector of a power shelf, such as primary input 114 or secondary input 116 of power shelf 112 illustrated in FIG. 1, multi-pin connector 216 of primary input 206 or multi-pin connector 218 of secondary input 208 of power shelf 200 illustrated in FIG. 2, or primary or secondary inputs of power shelf 302 illustrated in FIG. 3. For example, multi-pin connector 504 includes pins number 1-7. Pin 1 has a ground or "protective earth (PE)" polarity. Pins 2 and 3 may be a set of pins that connect to a first neutral domain of a power shelf and have a live 1 polarity and neutral 1 polarity. Pins 4 and 5 may be a set of pins that connect to a second neutral domain of a power shelf and have a live 2 polarity and a neutral 2 polarity. Pins 6 and 7 may be another set of pins that connect to a third neutral domain of a power shelf and have a live 3 and neutral 3 polarity. Note that the pin arrangement and pin polarities of the pins of multi-pin connector 504 of power adapter 500 and the pin arrangement and pin polarities of the pins of multi-pin connector 404 of power adapter 400 may be the same. Thus, from the perspective of the power shelf, power adapter 400 and power adapter 500 may be interchangeable.

Live pin 2, live pin 4, and live pin 6 of multi-pin connector 504 may respectively be connected to live connection 1, live connection 2, and live connection 3 of three-phase connector 502. Also, junction 518 (a more detailed view of junction 508) may split the neutral connection of three-phase connector 502 such that pins 3, 5, and 7 of multi-pin connector 504 are each electrically coupled to the neutral connection of three-phase connector 502.

Figure 6A:
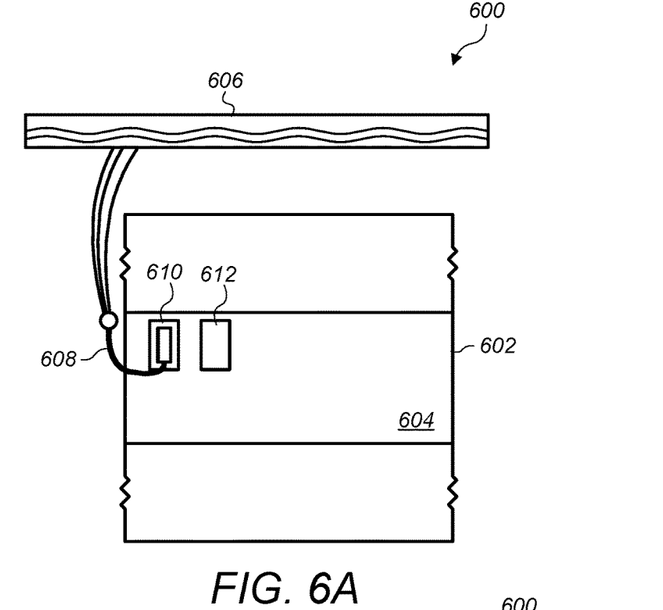
FIG. 6A is a schematic diagram illustrating a data center comprising a single-phase power distribution system and a rack power shelf, according to some embodiments.

FIG. 6A is a schematic diagram illustrating a data center comprising a single-phase power distribution system and a rack power shelf, according to some embodiments.

Data center 600 includes rack 602 comprising power shelf 604. Data center 600 also includes a single-phase power distribution system comprising a cable tray 606. In some embodiments, rack 602 comprising power shelf 604 may be installed in an existing data center 600 comprising other racks with different power systems. For example, other racks in data center 600 may include rack power distribution units that distribute single-phase power to power supplies included in individual servers mounted in the racks. In some situations, three-phase power may not be available to rack 602 when it is initially installed in data center 600. For example, a three-phase power distribution system may not have yet been installed in data center 600. In such circumstances, three single-phase power connections may be made between single-phase power lines in cable tray 606 and single-phase power adapter 608. Singe-phase power adapter 608 may be a similar power adapter as power adapter 120 described in regard to FIG. 1 or power adapter 400 illustrated in FIGS. 4A-C. In some embodiments, single-phase power provided by power lines of cable-tray 606 may include upstream automatic transfer switches and uninterruptible power supplies that provide redundancy and backup support to power distributed via the single-phase power distribution system comprising cable tray 606.

Single-phase power adapter 608 is also connected to primary input 610 of power shelf 604 and secondary input 612 of power shelf 604 is not connected to a power source.

Figure 6B:
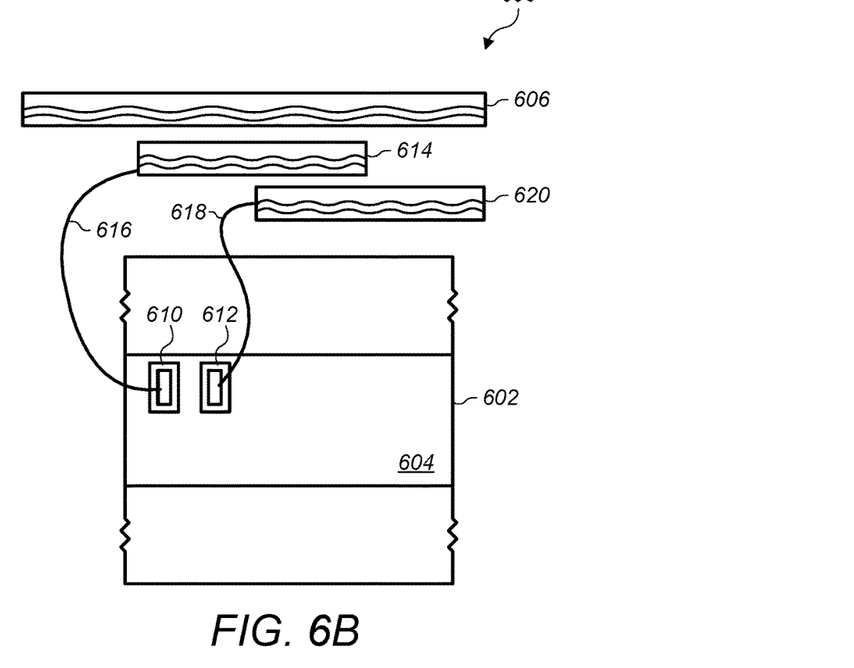
FIG. 6B is a schematic diagram illustrating a data center comprising a three-phase power distribution system and a rack power shelf, according to some embodiments.

FIG. 6B is a schematic diagram illustrating a three-phase power distribution system being added to a data center and connected to a power shelf, according to some embodiments. A three-phase power distribution system comprising a cable tray 614 and 620 may be installed in data center 600 while electrical loads in rack 602 are receiving power supplied from the single-phase power distribution system comprising cable tray 606. Also, while electrical loads in rack 602 are receiving power supplied from the single-phase power distribution system comprising cable tray 606, power shelf 604 may be migrated from receiving single-phase power from power lines of cable tray 606 to instead receiving three-phase power from power lines of cable trays 614 and 620.

Figure 7:
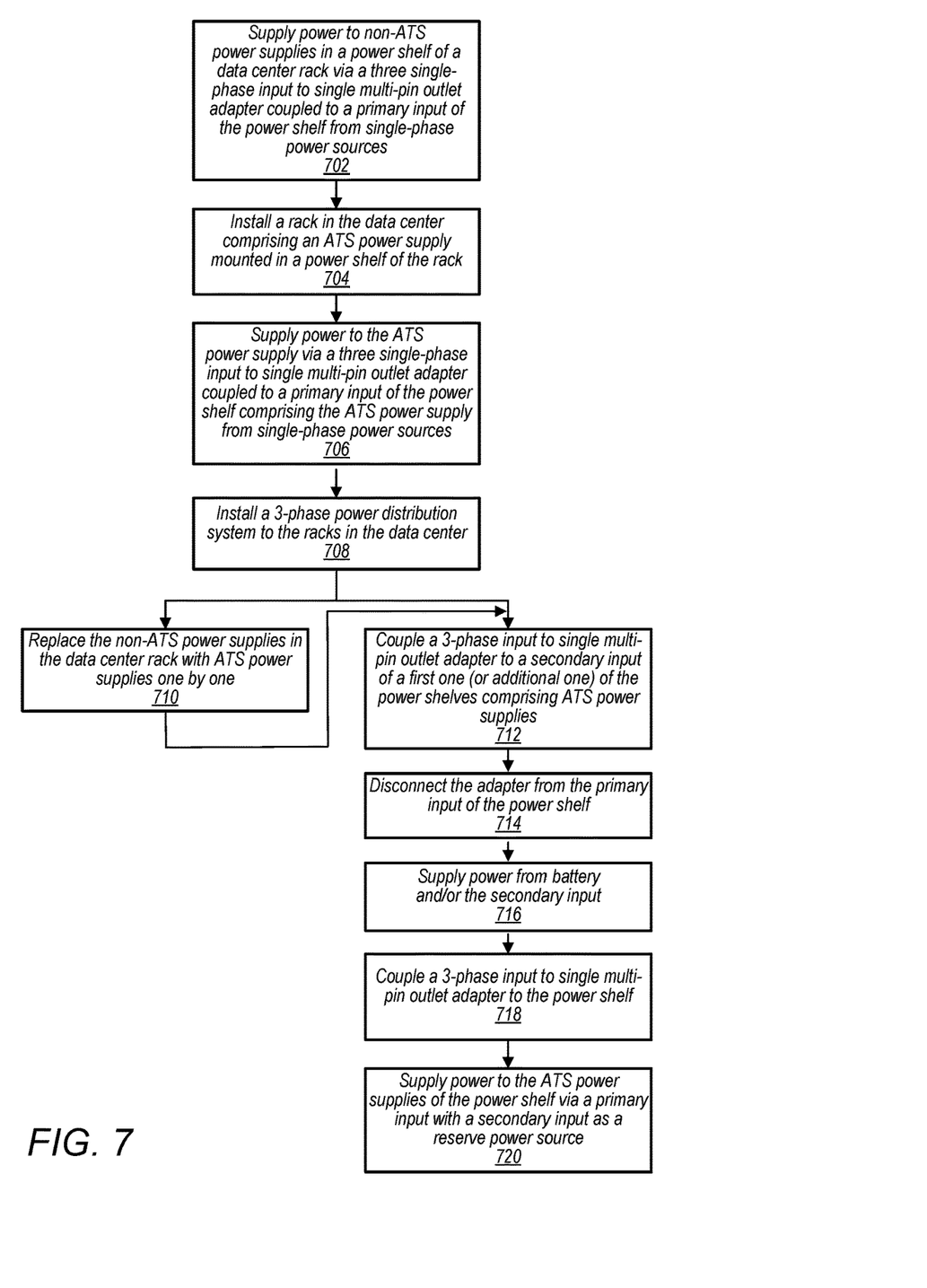
FIG. 7 is a flowchart illustrating migrating a data center from supplying single-phase power to racks to supplying three-phase power to racks, according to some embodiments.

A similar process as described in FIG. 1 or in FIG. 7 may be followed to migrate power shelf 604 from being supplied single-phase power to being supplied three-phase power. As part of migrating power shelf 604 from receiving single-phase power to receiving three-phase power, the power shelf may be connected to three-phase power sources from cable tray 620 via a power adapter, such as power adapter 126 as described in regard to FIG. 1 coupled to secondary input 612 and another power adapter such as power adapter 132 described in regard to FIG. 1 coupled to primary input 610. Both of the power adapters 616 and 618 coupled to primary input 610 and secondary input 612, respectively, may be power adapters such as power adapters 126 or 132, or a power adapter such as power adapter 500 illustrated in FIGS. 5A-C. After, three-phase power source is connected to secondary input 612 via power adapter 618 connected to a three-phase power source from cable tray 620, another three-phase power source from cable tray 614 may be connected to primary input 610 via power adapter 616. Thus, primary input 610 and secondary input 612 may be connected to independent three-phase power sources, such as a primary three-phase power source and a reserve three-phase power source. While a single-phase power distribution system and a three-phase power distribution system have been described herein using cable trays for ease of illustration, in some embodiments various other systems or methods may be used to transmit single-phase or three-phase power to a rack comprising a power shelf.

In some embodiments, in addition, to migrating a power shelf from receiving single-phase power to receiving three-phase power, power supplies in the power shelf may be exchanged for power supplies that include automatic transfer switches configured to selectively feed power from a primary power source or a secondary power source, such as primary input 610 or secondary input 612 of power shelf 604. In some embodiments, a power shelf may include N+1 power supplies, meaning that the power shelf includes at least one more power supply than a number of power supplies (N) required to support electrical loads that are supplied power from the power shelf. Because the power shelf includes at least one more power supply than is needed to support the electrical loads that receive power from the power shelf, power supplies of the power shelf may be exchanged for ATS power supplies, one at a time, while power continues to be supplied to the electrical loads in the rack that receive power from the power shelf via other ones of the power supplies of the power shelf.

FIG. 7 is a flowchart illustrating converting a data center from supplying single-phase power to racks to supplying three-phase power to racks, according to some embodiments.

At 702 power is supplied to non-ATS power supplies in a power shelf of a data center rack. The power is supplied via three single-phase connections to a power adapter, such as power adapter 400, wherein a multi-pin connector of the power adapter is coupled to a primary input of the power shelf.

At 704, another rack is installed in the data center comprising a power shelf that includes power supplies that include automatic transfer switching functionality (ATS power supplies). At 706, single-phase power is supplied to the power shelf that includes ATS power supplies via a power adapter, such as power adapter 400, coupled at one end to three-single-phase power sources, and coupled at another end to a primary input of the power shelf that includes the ATS power supplies.

At 708, 3-phase power is added to the data center. For example a 3-phase power distribution system such as cable tray 614 illustrated in FIG. 6B may be installed in the data center.

At 710, at least some of the non-ATS power supplies installed in racks in the data center are exchanged for ATS power supplies. However, in some embodiments, non-ATS power supplies may remain in power shelves or may be replaced at a later time. Thus, in some embodiments 710 may be omitted.

At 712, a power adapter, such as power adapter 500, is coupled to a secondary input of one of the power shelves that is being migrated from being supplied single-phase power to being supplied three-phase power. Note that steps 712-720 may be repeated for each power shelf that is being migrated from being supplied single-phase power to being supplied three-phase power.

At 714, the power adapter coupled to the primary input of the power shelf being migrated is disconnected from the primary input of the power shelf.

At 716, while a power source is not connected to the primary input of the power shelf, power may be fed to one or more electrical loads that receive power from the power shelf from a battery included in or associated with the power shelf. Also, power supplied to the power shelf from the three-phase power source coupled to the secondary input may be fed to the one or more electrical loads that receive power from the power shelf. The power received from the secondary input may be routed to sets of power supplies that convert the three-phase alternating current power into DC power that is fed to the downstream electrical loads that receive power from the power shelf.

At 718, a power adapter, such as power adapter 500, is coupled to the primary input of the power shelf at one end and is coupled to a three-phase power source at the other end.

At 720, three-phase power is supplied to the power shelf via the three-phase power adapter coupled to the primary input. Also, the three-phase power adapter coupled to the secondary input provides reserve power to the power shelf in case there is a loss of power from the three-phase power source coupled to the primary input. In some embodiments, three-phase power coupled to the primary input and three-phase power coupled to the secondary input of the power shelf may be from separate three-phase power systems with minimal overlapping failure modes.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A method comprising:
coupling a second power adapter to a secondary input of a power shelf of a rack while power is being supplied to the power shelf via a first power adapter coupled to a primary input of the power shelf, wherein the power shelf supplies power received at the primary input or the secondary input to one or more electrical loads in the rack,
wherein the second power adapter comprises a multi-pin connector configured to couple with the secondary input and another connector configured to couple with a three-phase power source, and
wherein the first power adapter comprises a multi-pin connector coupled to the primary input and three other connectors each coupled to respective single-phase power sources;
disconnecting, while power is being supplied to the one or more electrical loads, the first power adapter from the primary input of the power shelf; and
coupling, while power is being supplied to the one or more electrical loads, a third power adapter to the primary input of the power shelf, wherein the third power adapter comprises a multi-pin connector configured to couple with the primary input and another connector configured to couple with a three-phase power source.

2. The method of claim 1, further comprising:
supplying electrical power from a primary input of the power shelf to respective neutral domains of the power shelf, wherein the power shelf comprises one or more power supplies in respective ones of the separate neutral domains, each configured to convert alternating current (AC) power to direct current (DC) power.

3. The method of claim 1, wherein at least a portion of the power supplied to the one or more electrical loads after the first power adapter is disconnected from the primary input and before the third power adapter is coupled to the primary input is supplied to the power shelf from a three-phase power source via the second power adapter coupled to the secondary input or is supplied to the one or more electrical loads in the rack from a battery of the power shelf.

4. The method of claim 1, further comprising:
replacing a power supply mounted in the power shelf with a power supply that comprises an automatic transfer switch configured to selectively feed power to the one or more electrical loads from the primary power input or the secondary power input of the power shelf.

5. The method of claim 4, wherein the power shelf comprises multiple power supplies, wherein electrical power is supplied to the one or more electrical loads from other ones of the power supplies of the rack while the power supply mounted in the rack is being replaced with the power supply that comprises the automatic transfer switch.

6. A method comprising:
receiving power at a rack power shelf from three single-phase power sources via a power adapter comprising a multi-pin connector at a first end and three connectors at a second end, wherein each of the three connectors are configured to couple to respective ones of the three single-phase power sources; and
receiving power at the rack power shelf from a three-phase power source via another power adapter comprising a multi-pin connector at a first end and another connector at a second end configured to couple to the three-phase power source.

7. The method of claim 6, further comprising:
coupling, at a primary input of the rack power shelf, with the power adapter comprising the multi-pin connector at the first end and the three connectors at the second end; and
coupling, at a secondary input of the rack power shelf, with the other power adapter comprising the multi-pin connector at the first end and the three-phase power connector at the second end.

8. The method of claim 7, further comprising:
decoupling, at the primary input, from the power adapter comprising the multi-pin connector at the first end and the three connectors at the second end; and
switching, via an automatic transfer switch of a power supply mounted in the rack power shelf, from feeding power to the one or more electrical loads from the primary input to instead feeding power to the one or more electrical loads from the secondary input.

9. The method of claim 8, further comprising:
prior to said switching, changing a mode of the power supply from an automatic transfer switching disabled mode to an automatic transfer switching enabled mode.

10. The method of claim 6, further comprising:
supplying, in response to a loss of power at the primary input of the rack power shelf, power to the one or more electrical loads from a battery of the rack power shelf.

11. The method of claim 6, wherein the power adapter comprising the multi-pin connector at the first end and the three connectors at the second end comprises separate respective neutral lines from each of the three single-phase connectors to respective neutral pins of the multi-pin connector.

12. The method of claim 6, wherein the other power adapter comprising the multi-pin connector at the first end and the three-phase connector at the second end comprises neutral lines that connect a neutral connection of the three-phase connector to multiple neutral pins of the multi-pin connector.

13. The method of claim 6, further comprising:
supplying electrical power from a primary input of the rack power shelf to respective neutral domains of the rack power shelf, wherein the rack power shelf comprises one or more power supplies in respective ones of the separate neutral domains, each configured to convert alternating current (AC) power to direct current (DC) power, wherein, a backplane of the rack power shelf is configured to isolate AC power in each of the respective neutral domains from AC power in the other ones of the neutral domains.

14. A system comprising:
a plurality of computing devices mounted in a rack;
a power shelf configured to supply power to the plurality of computing devices;
a first power adapter comprising:
a multi-pin connector at a first end of the first power adapter; and
three connectors at a second end of the first power adapter, wherein each of the three connectors are configured to couple to a respective single-phase power source; and
a second power adapter comprising:
a multi-pin connector at a first end of the second power adapter; and a connector at a second end of the second power adapter configured to couple to a three-phase power source,
wherein the power shelf is configured to receive three-phase power via the second power adapter and is configured to receive three single-phase power inputs via the first power adapter.

15. The system of claim 14, wherein the first power adapter comprises separate respective neutral lines from each of the three single-phase connectors to respective neutral pins of the multi-pin connector of the first power adapter.

16. The system of claim 14, wherein the second power adapter comprises a neutral line from the three-phase connector that is coupled to multiple neutral pins of the multi-pin connector of the second power adapter.

17. The system of claim 14, wherein the power shelf comprises a multi-pin connector, and wherein the first power adapter and the second power adapter each comprise a corresponding multi-pin connector configured to couple with the multi-pin connector of the power shelf.

18. The system of claim 17, wherein the power shelf comprises one or more power supplies in separate neutral domains configured to convert alternating current (AC) power to direct current (DC) power,
wherein the power shelf comprises a backplane configured to isolate AC power in each of the respective neutral domains from AC power in the other ones of the neutral domains, and
wherein each of the separate respective neutral domains are coupled to separate respective neutral pins of the multi-pin connector of the power shelf.

19. The system of claim 18, wherein the multi-pin connector of the power shelf comprises:
a first live pin and a first neutral pin;
a second live pin and a second neutral pin;
a third live pin and a third neutral pin; and
a ground pin.

20. The system of claim 14, wherein each of the three connectors of the first power adapter comprises a live connection, a neutral connection, and a ground connection; and
wherein the three-phase connector at the second end of the second power adapter comprises three live connections, a neutral connection, and a ground connection.

* * * * *